United States Patent
Huh et al.

(10) Patent No.: US 8,582,368 B2
(45) Date of Patent: *Nov. 12, 2013

(54) NON-VOLATILE MEMORY DEVICE AND OPERATING METHOD OF THE SAME

(75) Inventors: Hwang Huh, Gyeonggi-do (KR); Seong-Je Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 330 days.

This patent is subject to a terminal disclaimer.

(21) Appl. No.: 12/833,582

(22) Filed: Jul. 9, 2010

(65) Prior Publication Data

US 2011/0038215 A1 Feb. 17, 2011

(30) Foreign Application Priority Data

Aug. 11, 2009 (KR) .................. 10-2009-0073833

(51) Int. Cl.
*G11C 11/34* (2006.01)
(52) U.S. Cl.
USPC ...................................................... 365/185.22
(58) Field of Classification Search
USPC ...................................................... 365/185.22
See application file for complete search history.

(56) References Cited

U.S. PATENT DOCUMENTS

| | | | |
|---|---|---|---|
| 7,276,874 B2 * | 10/2007 | Aoki et al. | 318/560 |
| 2006/0220100 A1 * | 10/2006 | Tanaka et al. | 257/315 |
| 2008/0175068 A1 * | 7/2008 | Houston et al. | 365/185.27 |
| 2009/0154250 A1 * | 6/2009 | Lin | 365/185.22 |
| 2009/0201724 A1 * | 8/2009 | Akaogi | 365/185.2 |

FOREIGN PATENT DOCUMENTS

| | | |
|---|---|---|
| KR | 1020070080037 | 7/2008 |
| KR | 1020090026092 | 3/2009 |

OTHER PUBLICATIONS

Notice of Allowance issued from Korean Intellectual Property Office on Nov. 16, 2011.

* cited by examiner

*Primary Examiner* — Hoai V Ho
*Assistant Examiner* — Min Huang
(74) *Attorney, Agent, or Firm* — IP & T Group LLP

(57) ABSTRACT

A method for operating a non-volatile memory device includes counting the number of consecutive verify operations performed without a precharge, sensing a temperature, and when the number of verify operations exceeds a set value of verify operations, controlling a level of a sensing bias voltage based on the sensed temperature.

6 Claims, 3 Drawing Sheets

… (1)

NON-VOLATILE MEMORY DEVICE AND OPERATING METHOD OF THE SAME

CROSS-REFERENCE TO RELATED APPLICATIONS

The present application claims priority of Korean Patent Application No. 10-2009-0073833, filed on Aug. 11, 2009, which is incorporated herein by reference in its entirety.

BACKGROUND OF THE INVENTION

The exemplary embodiments of the present invention relate to a non-volatile memory device, and more particularly, to a technology for improving a fast verify operation of a non-volatile memory device.

Memory devices are divided into a volatile memory device and a non-volatile memory device according to whether data are maintained or not when a power supply is cut off. The volatile memory device is a memory device whose data are not stored when a power supply is cut off, and examples of the volatile memory include a dynamic random access memory (DRAM) and static random access memory (SRAM). The non-volatile memory device is a memory device whose data are stored even when a power supply is cut off, and examples of the non-volatile memory include a flash memory.

Main operations of the non-volatile memory device include an erase operation, a read operation, a programming operation. Herein, what determines the characteristics of a product is write performance related to the programming operation. Write performance is a value defined as the amount of data that may be recorded during a period equal to one second in time. Many different ideas for improving the write performance have been suggested. One such method is a fast verify method, which reduces the operation time for verify among specific operations of the programming operation, which include a program pulse application operation and a verify operation.

The verify operation is an operation for determining whether a threshold voltage is shifted to a level desired for a cell after programming and the verify operation requires longer time than the program pulse application operation. Therefore, reducing the time required for the verify operation is an effective way to improve the write performance. A cycle of the verify operation includes a bit line precharge operation, an evaluation operation, and a sensing operation. The fast verify method requires a one-time bit line precharge operation and a plurality of evaluation operations and sensing operations. In short, the time required for verify is shortened by performing the verify operation multiple times while performing the bit line precharge operation just one time.

FIG. 1 illustrates a structure of a conventional cell array of a non-volatile memory device. Referring to FIG. 1, the non-volatile memory device includes a plurality of memory cells for storing data, a plurality of word lines WL, a plurality of bit lines BL, a page buffer 110, and a connector 120 for electrically coupling the bit lines BL with the page buffer 110. Herein, the memory cells are serially connected between a source selection transistor, which is a transistor receiving source selection line (SSL), and a drain selection transistor, which is transistor receiving drain selection line (DSL), to thereby form a string structure.

Hereafter, the verify operation, which is performed the same as the read operation, will be described. For the sake of convenience in description, it is assumed that a word line WL0 is selected and the verify operation is performed for a memory cell coupled with the word line WL0.

First, the page buffer 110 supplies a power source voltage VCC to a sensing node S0. Then, a precharge bias V1 is applied to a PBSENSE node of the connector 120. When the precharge bias V1 is applied, the connector 120 electrically connects the sensing node S0 with a bit line BL and accordingly the bit line BL is precharged to the level of the power source voltage VCC. This is referred to as "a bit line precharge operation." During the precharge operation, the drain selection transistor is turned on while the source selection transistor is turned off.

Subsequently, a ground voltage VSS is applied to the PBSENSE node to electrically disconnect the page buffer 110 and a bit line BL from each other. A read voltage is applied to the word line WL0 and turn-on voltage is applied to the other word lines WL1 to WLN. Herein, the read voltage is a voltage for detecting a threshold voltage of a memory cell connected to the word line WL0, and the turn-on voltage is a voltage for turning on a transistor regardless of data recorded in a memory cell. Then, the potential of the bit line BL is maintained at the level of the power source voltage VCC or the potential of the bit line BL is not maintained at the level of the power source voltage VCC and dropped based on whether the memory cell coupled with the word line WL0 is properly programmed or not. This is called an evaluation operation. During the evaluation operation, both drain selection transistor and source selection transistor are all turned on.

After the evaluation operation, a sensing bias voltage V2 is applied to the PBSENSE node. As a result, the bit line BL and the page buffer 110 are electrically connected to each other, and the page buffer 110 senses the potential of the bit line BL and determines whether the memory cell is properly programmed or not. This is referred to as "a sensing operation."

FIG. 2 is a timing diagram illustrating a conventional fast verify process. Referring to FIG. 2, WL represents the potential of a selected word line WL, and PBSENSE represents the gate potential of the connector 120. BL represents the potential of a bit line.

A reference numeral '210' represents a precharge duration, during which the precharge voltage V1 is applied to the PBSENSE node to precharge the bit line BL to the level of the power source voltage VCC.

A reference numeral '220' represents a first verify duration, which includes an evaluation section 221 and a sensing section 222. In examining the evaluation operation 221, a first read voltage VREAD1 is applied to the word line WL and the bit line BL is evaluated based on the first read voltage VREAD1. When the memory cell coupled with the word line WL is turned off, the potential of the bit line BL follows along the solid line in the drawing. When the memory cell coupled with the word line WL is turned on, the potential of the bit line BL follows along the dotted line in the drawing. This is the same in the second and third verify durations as well. In examining the operation in the sensing section 222, a sensing bias voltage V2 is applied to the PBSENSE node, and as a result, the bit line BL and the page buffer 110 are electrically connected to each other. Then, the page buffer 110 determines whether the potential of the bit line BL maintains the level of the initial precharge voltage VCC and performs a sensing operation.

Reference numerals '230' and '240' indicate the second and third verify operations, respectively. In the verify operations, a second read voltage VREAD2 and a third read voltage VREAD3 are applied, respectively, and the verify operations are performed through an evaluation section 231 or 241 and a sensing section 232 or 242.

A fast verify operation features a plurality of verify operations 220, 230 and 240 performed with one-time bit line precharge 210. However, a bit line BL inevitably has leakage current incurred therein and thus the precharge voltage VCC level cannot be maintained in the bit line BL. As to the solid line representing the potential of the bit line BL in the drawings, although the memory cell coupled with the word line WL is not turned on, the potential of the bit line BL does not maintain the initial precharge voltage VCC level and gradually drops. Since the potential of the bit line BL does not maintain the initial precharge voltage VCC level, there is a limitation in the number of verify operations performed during the fast verify operation. Particularly, since the amount of the leakage current increases at a high temperature, this raises a concern.

SUMMARY OF THE INVENTION

An embodiment of the present invention is related to a concern that there is a limitation in the number of verify operations due to a situation where a bit line does not maintain the initial precharge level during a fast verify operation.

In accordance with an embodiment of the present invention, a method for operating a non-volatile memory device includes: sensing a temperature; and controlling a level of a sensing bias voltage based on the sensed temperature.

In accordance with another embodiment of the present invention, a method for operating a non-volatile memory device includes: counting the number of consecutive verify operations performed without a precharge; sensing a temperature; and when the number of verify operations exceeds a set value of verify operations, controlling a level of a sensing bias voltage based on the sensed temperature.

In accordance with another embodiment of the present invention, a non-volatile memory device includes: a thermosensor configured to sense a temperature to thereby generate a temperature signal; a micro controller configured to generate a sensing bias control signal based on a number of verify operations performed without precharge, a set value of verify operations, and the temperature signal; and a voltage generator configured to generate a sensing bias voltage in response to the sensing bias control signal.

The connector may be configured to electrically connect a bit line to a page buffer in response to the sensing bias voltage.

DESCRIPTION OF SPECIFIC EMBODIMENTS

Hereinafter, specific embodiments will be described with reference to the accompanying drawings. The drawings are not necessarily to scale and in some instances, proportions may have been exaggerated in order to clearly depict certain features of the embodiments.

Figure 1:
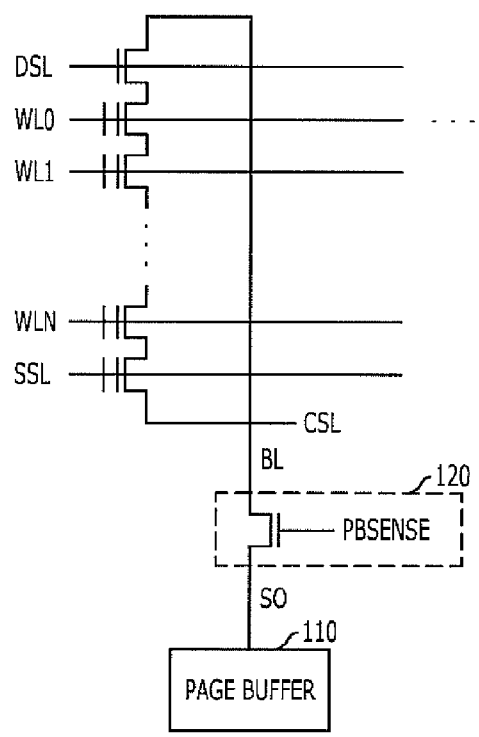
FIG. 1 illustrates a structure of a conventional cell array of a non-volatile memory device.
Figure 2:
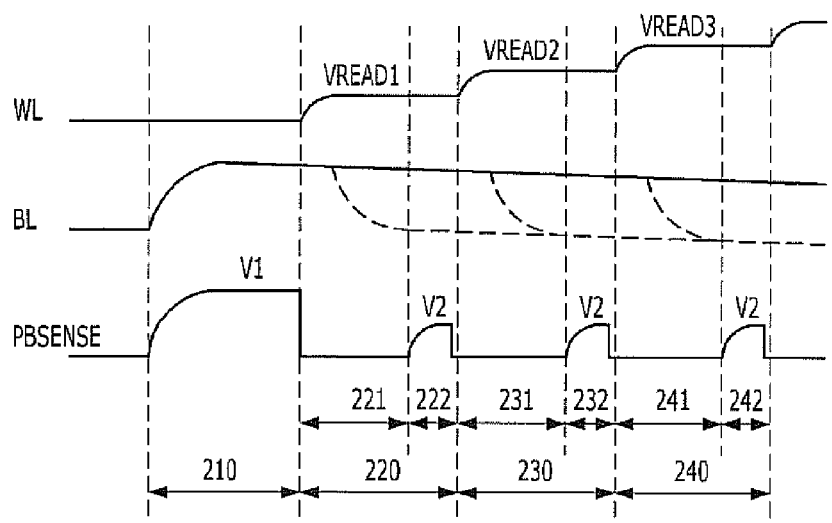
FIG. 2 is a timing diagram illustrating a conventional fast verify process.
Figure 3:
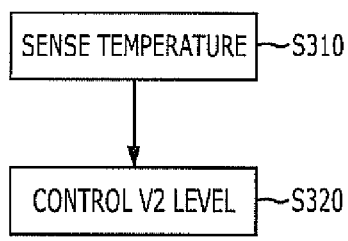
FIG. 3 is a flowchart describing a method for operating a non-volatile memory device in accordance with a first embodiment.

FIG. 3 is a flowchart describing a method for operating a non-volatile memory device in accordance with a first embodiment. Referring to FIG. 3, the method for operating a non-volatile memory device in accordance with the first embodiment includes sensing a temperature in step S310 and controlling the level of a sensing bias voltage V2 based on the sensed temperature.

During a verify operation, which is a read operation, a page buffer 110 senses a data based on whether the potential level of a bit line BL is maintained at the level of the power source voltage VCC or dropped from the level of the power source voltage VCC. The potential level of the bit line BL is recognized as a connector 120 senses how much electric current flows out of the page buffer 110 to the bit line BL. When the potential level of the bit line BL is maintained (that is, at the level of the power source voltage VCC or close thereto), no electric current will flow from the page buffer 110 to the bit line BL. When the potential level of the bit line BL is decreased, electric current will flow from the page buffer 110 to the bit line BL.

When large leakage current occurs under the condition of high temperature and the precharge voltage level of the bit line BL is dropped, it may be erroneously determined that the potential level of the bit line BL is dropped although a target memory cell for verify operation, i.e., a read operation, is not turned on. According to an embodiment of the present embodiment, a method of controlling the level of sensing bias voltage V2 based on the temperature is used.

When the level of the sensing bias voltage V2 applied as PBSENSE is high, the connector 120 is strongly turned on and thus electric current may flow easily from the page buffer 110 to the bit line BL. On the other hand, when the level of the sensing bias voltage V2 is low, the connector 120 is turned on weakly and thus electric current may not flow easily from the page buffer 110 to the bit line BL. Therefore, under a high-temperature environment where the precharge voltage level of the bit line BL may be dropped, a failure that occurs from a drop in the precharge voltage level of the bit line BL may be prevented/reduced by controlling the level of the sensing bias voltage V2 to be at a low level.

Figure 4:
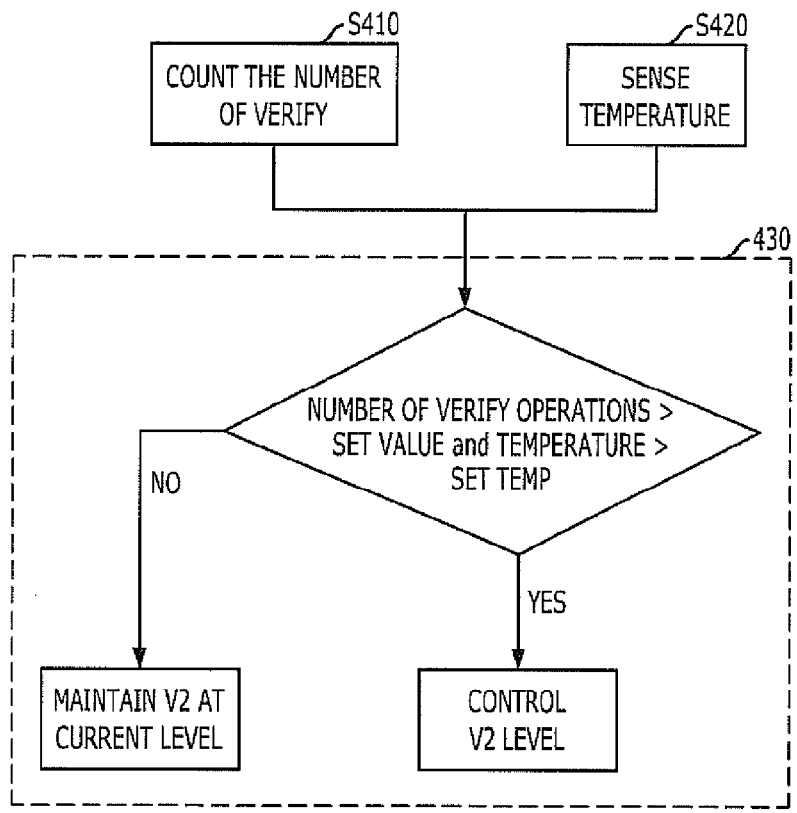
FIG. 4 is a flowchart describing a method for operating a non-volatile memory device in accordance with a second embodiment.

FIG. 4 is a flowchart describing a method for operating a non-volatile memory device in accordance with a second embodiment. While sensing a temperature and controlling the level of a sensing bias voltage V2 applied as PBSENSE based on the sensed temperature has been described for the first embodiment, controlling the level of a sensing bias voltage based on the temperature will be described for the second embodiment.

Referring to FIG. 4, the method for operating a non-volatile memory device in accordance with the second embodiment includes counting the number of consecutive verify operations performed without a precharge (that is, after the initial precharge) in step S410; sensing a temperature in step S420; and when the number of verify operations exceeds a setting value, controlling the level of a sensing bias voltage V2 based on the sensed temperature in step S430.

In the step S410, "the number of consecutive verify operations without a precharge" means the number of verify operations after the initial bit line BL precharge during a fast verify operation.

In step S430, the level of the sensing bias voltage V2 is controlled only when the number of consecutive verify operations detected in the step S410 exceeds the setting value. In the fast precharge operation, since the bit line BL is precharged in the initial stage, the potential of the bit line BL precharge voltage is scarcely dropped. Therefore, it does not have to control the level of the sensing bias voltage V2 in the initial stage of the fast verify operation. However, as the number of the verify operations increases, for example, from the third verify operation, the sensing bias voltage V2 needs to be controlled based on the temperature because long time has passed since the initial precharge. Therefore, in the second embodiment, the level of the sensing bias voltage V2 is controlled based on the temperature from the moment when the verify operation is repeated for more than the set value for the fast verify operation. Herein, the set value may be a number such as 1, 2, 3 or 4.

In the step S430, when the current number of consecutive verify operations exceeds the set value and the sensed temperature is higher than a set temperature, the sensing bias is determined to be "A-a." Herein, 'A' denotes the level of the existing sensing bias voltage V2 and 'a' denotes the variation amount by which the sensing bias voltage V2 level is to be controlled in the present embodiment when the foregoing conditions are fulfilled.

Figure 5:
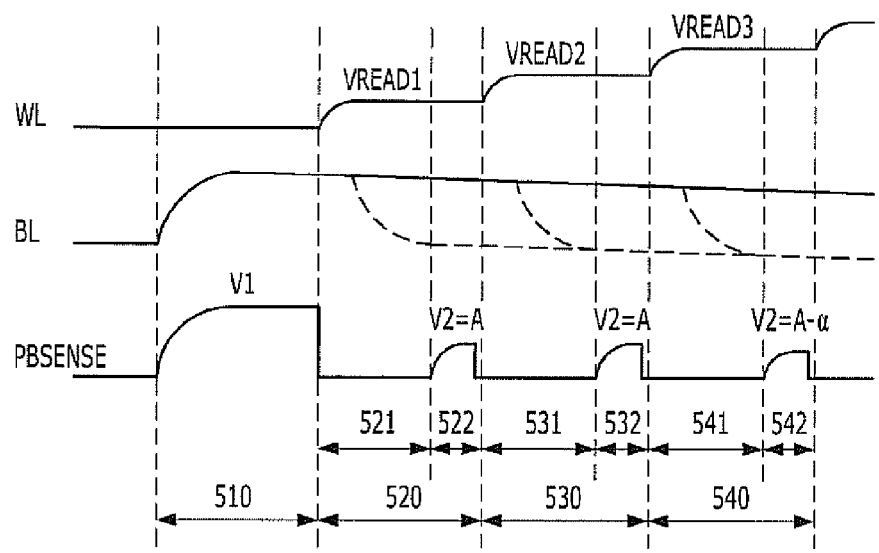
FIG. 5 is a timing diagram illustrating a fast verify operation of a non-volatile memory device to which the method of FIG. 4 is applied.

FIG. 5 is a timing diagram illustrating a fast verify operation of a non-volatile memory device to which the method of FIG. 4 is applied. FIG. 5 illustrates the fast verify operation when a set value is 3 and the temperature is higher than a set temperature. A reference numeral '510' is a precharge duration, during which a precharge voltage is applied to a PBSENSE node and thus a bit line BL is precharged with the level of a power source voltage VCC.

A reference numeral '520' is the first verify duration and it includes an evaluation section 521 and a sensing section 522. Since the number of verify operations does not reach the set value, which is 3, the sensing bias voltage V2 has the level of A.

A reference numeral '530' is the second verify duration and it includes an evaluation section 531 and a sensing section 532. Since the number of verify operations does not reach the set value, which is 3, the sensing bias voltage V2 has the level of A.

A reference numeral '540' is the third verify duration and it includes an evaluation section 541 and a sensing section 542. Since the number of verify operations reaches the set value, which is 3, and the temperature is higher than the sensing temperature, the sensing bias voltage V2 is controlled to switch from the previous "A" voltage to "A-a" voltage. By controlling the level of the sensing bias voltage V2, it is possible to compensate the bit line BL even if the level of the initial precharge voltage VCC is not maintained.

Figure 6:
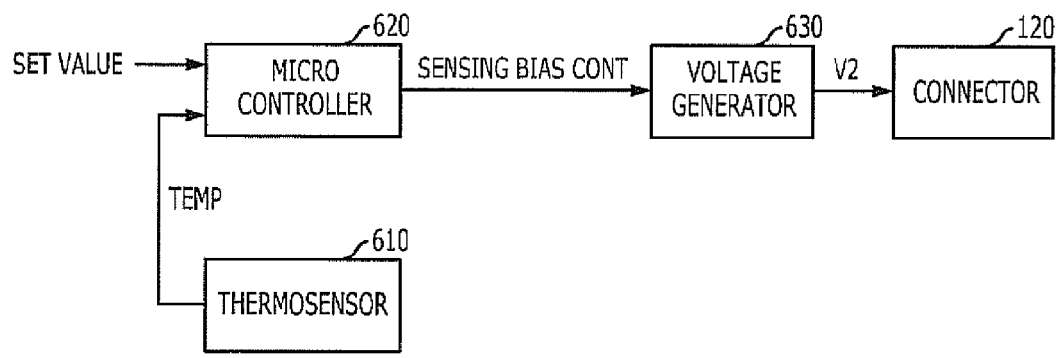
FIG. 6 is a block view describing a non-volatile memory device in accordance with an embodiment.

FIG. 6 is a block view describing a non-volatile memory device in accordance with an embodiment. Referring to FIG. 6, the non-volatile memory device includes a thermosensor 610, a micro controller 620, and a voltage generator 630. The thermosensor 610 senses a temperature to thereby generate a temperature signal TEMP. The micro controller 620 generates a sensing bias control signal SENSING BIAS CONT based on the number of verify operations performed without precharge and further based on a set value and the temperature signal TEMP. The voltage generator 630 generates a sensing bias voltage V2 in response to the sensing bias control signal SENSING BIAS CONT.

The generated sensing bias voltage V2 is inputted to a connector 120 which electrically connects a bit line BL to the page buffer 110 and determines the size of a current path between the bit line BL and the page buffer 110 during a sensing operation.

The thermosensor 610 senses a temperature and when the temperature of the non-volatile memory device is higher than a setting temperature, it activates and outputs the temperature signal TEMP. Otherwise, it outputs an inactivated temperature signal.

The micro controller 620 is a device realizing diverse algorithms for operating the non-volatile memory device. The micro controller 620 receives and/or uses information on how many times the verify operations have been performed before the current verify operation. The micro controller 620 generates a sensing bias control signal SENSING BIAS CONT, which is a signal for controlling the level of the sensing bias voltage V2. Herein, as illustrated in FIG. 4, the micro controller 620 generates the sensing bias control signal SENSING BIAS CONT so that the sensing bias voltage V2 is generated. In other words, if the current number of consecutive sensing operations is greater than a set value and the current temperature is higher than a set temperature, that is, if the temperature signal TEMP is activated, the micro controller 620 changes the sensing bias control signal SENSING BIAS CONT to make the voltage generator 630 to change the level of the sensing bias voltage V2.

The voltage generator 630 generates the sensing bias voltage V2 of a potential level based on the information included in the sensing bias control signal SENSING BIAS CONT.

According to one embodiment of the present disclosure, a sensing bias voltage level is controlled based on a temperature. Therefore, although large leakage current occurs and thereby the potential of a bit line becomes lower than a precharge voltage level, a verify operation may be performed without a failure in sensing operation.

Also, according to one embodiment, when the number of consecutive verify operation exceeds a predetermined number, a method of controlling the sensing bias voltage level based on the temperature is used. The sensing bias voltage level is controlled only when the potential of the bit line is not properly maintained. Therefore, stable operation may be secured.

In conclusion, the technology of one embodiment of the present disclosure resolves the problem of restriction imposed on the limited number of verify operation that may be performed at a high temperature during a fast verify operation to thereby improve a write performance.

While the present invention has been described with respect to the specific embodiments, it will be apparent to those skilled in the art that various changes and modifications may be made without departing from the spirit and scope of the invention as defined in the following claims.

What is claimed is:

1. A method for operating a non-volatile memory device, the method comprising:
   counting, during a fast verify operation, a number of consecutive verify operations performed without a precharge;
   sensing a temperature; and
   controlling a level of a sensing bias voltage based on the sensed temperature if the number of consecutive verify operations exceeds a set value of verify operations.

2. The method of claim 1, wherein the controlling a level of a sensing bias voltage based on the sensed temperature comprises:
   decreasing, the level of the sensing bias voltage if the sensed temperature exceeds a set temperature.

3. A non-volatile memory device, comprising:
   a thermosensor configured to sense a temperature and to generate a temperature signal;
   a micro controller configured to receive the temperature signal and to:

count, during a fast verifies operation, a number of consecutive verify operations performed without a precharge operation;

generate a sensing bias control signal based on a set value of verify operations, the temperature signal, and the number of verify operations performed without the precharge operation; and a voltage generator configured to generate a sensing bias voltage in response to the sensing bias control signal.

4. The non-volatile memory device of claim 3, further comprising:

a connector configured to electrically connect a bit line to a page buffer in response to the sensing bias voltage.

5. The non-volatile memory device of claim 3, wherein the thermosensor is configured to activate the temperature signal when the sensed temperature is higher than a predetermined setting temperature.

6. The non-volatile memory device of claim 5, wherein the micro controller is configured to change the sensing bias control signal based on the temperature signal if the number of consecutive verify operations is greater than a set value.

* * * * *